United States Patent
Ahn et al.

(10) Patent No.: US 7,684,147 B2
(45) Date of Patent: Mar. 23, 2010

(54) MAGNETOELECTRONIC DEVICES BASED ON COLOSSAL MAGNETORESISTIVE THIN FILMS

(76) Inventors: Charles Ahn, 15 Prospect St., New Haven, CT (US) 06520-8284; Lior Klein, 9 Ma'aieh Hazofirn, Ramat-Gan 52488 (IL); Yosef Basson, 63 Ha'amakim, Ganey Tiqva 55900 (IL); Xia Hong, 420 Temple St., Room 308, New Haven, CT (US) 06511; Jeng-Bang Yau, 760 Mix Ave., Apt. 2B, Hamden, CT (US) 06514

(*) Notice: Subject to any disclaimer, the term of this patent is extended or adjusted under 35 U.S.C. 154(b) by 407 days.

(21) Appl. No.: 10/582,813
(22) PCT Filed: Dec. 15, 2004
(86) PCT No.: PCT/US2004/042200

§ 371 (c)(1),
(2), (4) Date: Jun. 14, 2006

(87) PCT Pub. No.: WO2005/060657

PCT Pub. Date: Jul. 7, 2005

(65) Prior Publication Data

US 2007/0096228 A1     May 3, 2007

Related U.S. Application Data

(60) Provisional application No. 60/529,676, filed on Dec. 15, 2003.

(51) Int. Cl.
G11B 5/37 (2006.01)
G11B 5/127 (2006.01)
H01L 29/82 (2006.01)

(52) U.S. Cl. .............. 360/112; 360/110; 360/119.1; 257/421; 257/422; 257/E21.665; 257/E27.005; 365/158; 365/171

(58) Field of Classification Search ........... 360/110, 360/112; 257/295, 296, 421, 422; 365/158, 365/171

See application file for complete search history.

(56) References Cited

U.S. PATENT DOCUMENTS

| | | | | |
|---|---|---|---|---|
| 5,361,226 A | * | 11/1994 | Taguchi et al. | 365/171 |
| 5,650,958 A | | 7/1997 | Gallagher et al. | |
| 5,686,879 A | * | 11/1997 | Schuhl et al. | 338/32 R |
| 5,721,654 A | * | 2/1998 | Manako et al. | 360/110 |
| 5,734,605 A | | 3/1998 | Zhu et al. | |

(Continued)

OTHER PUBLICATIONS

Bridging The Gap Between AMR, GMR, and Hall Magnetic Sensors, Popovic et al.

(Continued)

*Primary Examiner*—Dao H Nguyen
(74) *Attorney, Agent, or Firm*—Carmody & Torrance LLP

(57) ABSTRACT

The present invention is directed to the use of perovskite manganite thin films and other magnetic films that exhibit both planar Hall effect and biaxial magnetic anisotropy to form the active area in magnetic sensor devices and in magnetic bit cells used in magnetoresistive random access memory (MRAM) devices. The manganite thin films of the invention are ferromagnetic manganites of the formula $R_{1-x}A_xMnO_3$, wherein R is a rare-earth metal, A is an alkaline earth metal, and x is generally between about 0.15 and about 0.5.

18 Claims, 4 Drawing Sheets

U.S. PATENT DOCUMENTS

| | | | |
|---|---|---|---|
| 6,191,581 B1 * | 2/2001 | Van Dau et al. ............. | 324/249 |
| 6,646,948 B1 | 11/2003 | Stence et al. | |
| 6,654,278 B1 | 11/2003 | Engel et al. | |
| 6,714,442 B1 | 3/2004 | Nahas | |
| 6,818,961 B1 | 11/2004 | Rizzo et al. | |
| 6,822,838 B2 | 11/2004 | Lin et al. | |
| 2004/0070038 A1 | 4/2004 | Tang et al. | |
| 2004/0114283 A1 | 6/2004 | Felser | |
| 2004/0164840 A1 | 8/2004 | Xiao et al. | |

OTHER PUBLICATIONS

New Galvanomagnetic Effect, Goldberg et al., Physical Review, vol. 94, No. 5, pp. 1121-1125, Jun. 1954.

Galvanomagnetic Effects in Oriented Single Crystals of n-Type Germanium, Bullis, Physical Review, vol. 109, No. 2, pp. 292-301, Jan. 1958.

Spin valves with interlayer coupling domain biasing, Lu et al., Applied Physics Letters, vol. 80, No. 17, pp. 3156-3158, Apr. 2002.

Simultaneous detection of perpendicular and in-plane magnetization component in a $[Co/Pd]_n$ perpendicular magnetic recording media, Das et al., Journal of Applied Physics, vol. 93, No. 10, pp. 8098-8100, May 2003.

Ferromagnetic domain structure and hysteresis of exchange bias in NiFe/NiMn bilayers, Li et al., Physical Review B, vol. 65, 134421 (1)-(5), (2002).

Magnetoresistance and planar Hall effects in submicron exchange-coupled $NiO/Fe_{19}Ni_{81}$ wires, Nemoto et al., Applied Physics Letters, vol. 74, No. 26, pp. 4026-4028, Jun. 1999.

Anisotropic magnetoresistance and planar Hall effect in magnetic metal-insulator composite films, Zhao et al., J. Appl. Phys., vol. 81, No. 8, pp. 5527-5529, Apr. 1997.

Low-field magnetic sensors based on the planar Hall effect, Schuhl et al., Appl. Phys. Lett., vol. 66 No. 20, pp. 2751-2753, May 1995.

Giant Planar Hall Effect in Epitaxial (Ga,Mn)As Devices, Tang et al., Physical Review Letters, vol. 90, No. 10, pp. 107201 (1)-(4), Mar. 2003.

Microscopic mechanisms of giant magnetoresistance, Vouille et al., Physical Review B, vol. 60, No. 9, pp. 6710-6722, Sep. 1999.

Large Magnetoresistance at Room Temperature in Ferromagnetic Thin Film Tunnel Junctions, Moodera et al., Physical Review Letters, vol. 74, No. 16, pp. 3273-3276, Apr. 1995.

Spintronics: A Spin-Based Electronics Vision for the Future, Wolf et al., Science, vol. 294, pp. 1488-1495, Nov. 2001.

Giant magnetoresistance of manganese oxides with a layered perovskite structure, Moritomo et al., Letters To Nature, vol. 380, pp. 141-144, Mar. 1996.

Low-field magnetoresistance in tetragonal $La_{1-x}Ca_xMnO_3$ films, O'Donnell et al., Physical Review B, vol. 55, No. 9, pp. 5873-5879, Mar. 1997.

Magnetic anisotropy and strain states of (001) and (110) colossal magnetoresistance thin films, Berndt et al., Applied Physics Letters, vol. 77, No. 18, pp. 2903-2905, Oct. 2000.

Nano-junction: Spin-dependent tunneling and Coulomb blockade, Feltin, Online Nanotechnologies Journal, vol. II, Issue 2, pp. 1-9, Mar. 2001.

Micromagnetic and magnetoresistance studies of ferromagnetic $La_{0.83}Sr_{0.13}MnO_{2.98}$ crystals, Popov et al., Physical Review B, vol. 65, 064426(1)-(8), 2002.

Magnetic anisotropy of ferromagnetic $La_{0.7}Sr_{0.3}MnO_3$ epitaxial thin films: Dependence on temperature and film thickness, Steenbeck et al., Applied Physics Letters, vol. 80, No. 18, pp. 3361-3363, May 2002.

Magnetic switching and magnetoresistance in nanoscale spin tunnel junctions, Urech et al., Journal of Applied Physics, vol. 92, No. 10, pp. 6062-6065, Nov. 2002.

Room temperature ultrahigh magnetoresistance in $La_{0.67}Sr_{0.33}MnO_3$ thin films with ordered nanometer structure, Zhang et al., Solid State Communications, vol. 131, pp. 271-274, 2004.

Magnetoresistive Sensors, Hauser et al., Talk: Workshop "Preparation, Properties, and Application of Thin Ferromagnetic Films", Wien; Jun. 15, 2000-Jun. 16, 2000; in: "*Proceedings of the Workshop 'Preparation, Properties, and Application of Thin Ferromagnetic Films'*", K. Riedling (ed.); Institut für Industrielle Elektronik und Materialwissenschaften, TU Wien (2000), pp. 15-27.

Closing In On The Mystery Of Colossal Magnetoresistance, Preuss, Sciencebeat, Jul. 2001.

Transverse magnetovoltage in epitaxial $La_{0.67}Ca_{0.33}MnO_3$ thin films, C Mitze et al., Solid State Communications, vol. 109, (1999), pp. 189-194.

Giant planar Hall effect in colossal magnetroresistive $La_{0.84}Sr_{0.16}MnO_3$ thin films, Bason et al., Applied Physics Letters, vol. 84, No. 14, Apr. 5, 2004, pp. 2593-2395.

* cited by examiner

MAGNETOELECTRONIC DEVICES BASED ON COLOSSAL MAGNETORESISTIVE THIN FILMS

CROSS REFERENCE TO RELATED APPLICATIONS

This application is a National Stage application of International Application No. PCT/US2004/042200, filed Dec. 15, 2004, which claims the benefit of priority to U.S. Provisional Patent Application No. 60/529,676, filed on Dec. 15, 2003, the subject matter of which is herein incorporated by reference in its entirety.

STATEMENT REGARDING FEDERALLY SPONSORED RESEARCH OR DEVELOPMENT

This invention was partially made with U.S. Government support from the National Science Foundation Research Award No. DMR-0134721 and the Air Force Office of Scientific Research Award No. F49620-01-1-0330. Accordingly, the U.S. Government may have certain rights in this invention.

FIELD OF THE INVENTION

This invention is directed to the use of magnetic films exhibiting planar Hall effect and biaxial magnetic anisotropy in magnetic sensors and non-volatile memory devices.

BACKGROUND OF THE INVENTION

Memory devices are an extremely important component in electronic systems. The three most important commercial high-density memory technologies are SRAM, DRAM, and FLASH. Each of these memory devices uses an electronic charge to store information and each has its own advantages. For example, SRAM has fast read and write speeds, but it is volatile and requires a large cell area. DRAM has a high memory density, but it is also volatile and requires a refresh of the storage capacitor every few milliseconds. This refresh requirement increases the complexity of the control electronics.

FLASH is the major nonvolatile memory device in use today. Typical FLASH memory devices use charges trapped in a floating oxide layer to store information. Drawbacks to FLASH include high voltage requirements and slow program and erase times. Also, FLASH memory has a poor write endurance of about $10^4$-$10^6$ cycles before memory failure. In addition, to maintain reasonable data retention, the thickness of the gate oxide has to stay above the threshold that allows electron tunneling. This thickness requirement severely restricts the scaling trends of FLASH memory.

To overcome these shortcomings, magnetic memory devices are increasingly being evaluated. One such device is magnetoresistive random access memory (hereinafter referred to as "MRAM"). MRAM has the potential to have a speed performance similar to DRAM. To be commercially viable, however, MRAM needs to have comparable memory density to current memory technologies, be scalable for future generations, operate at low voltages, have low power consumption, and have competitive read/write speeds. For an MRAM device, the stability of the memory state, the repeatability of the read/write cycles, and the power consumption are some of the more important aspects of its design characteristics. A memory state in MRAM is not maintained by power, but rather by the direction of a magnetic moment vector. The magnetic moment is a physical property of ferromagnetic materials.

Current MRAM devices typically comprise a magnetoresistive tunneling junction (MTJ) memory cell that comprises two ferromagnetic layers separated by a thin, electrically insulating, tunnel barrier layer. The tunnel barrier layer is sufficiently thin that quantum-mechanical tunneling of charge carriers occurs between the ferromagnetic layers. The tunneling process is electron spin dependent, which means that the tunneling current across the junction depends on the spin-dependent electronic properties of the ferromagnetic materials and is a function of the relative orientation of the magnetizations of the two ferromagnetic layers.

In typical MRAM devices, storing data is accomplished by applying magnetic fields and causing a magnetic material in an MRAM cell to be magnetized into either of two possible memory states. Recalling data is accomplished by sensing the resistive state of the cell which depends on the magnetic state. The magnetic fields are created by passing currents through strip lines external to the magnetic structure or through the magnetic structures themselves.

The word line and digit line include conductive material through which a current can be passed. In one such system, described in U.S. Pat. No. 6,654,278 to Engel et al., the subject matter of which is herein incorporated by reference in its entirety, the word line is positioned on the top of the MRAM device and digit line is positioned on the bottom of the MRAM device and is directed at a 90° angle to word line. It is not necessary that conductors such as word line and digit line be in physical contact with the other layers of the MRAM device for efficient reading and writing operation, the conductors only need to be sufficiently near the regions to which the magnetic field is to be applied such that the magnetic field is effective. Examples of other MRAM devices are described in U.S. Pat. No. 6,714,442 to Nahas, U.S. Pat. No. 6,646,948 to Stence et al., and in U.S. Pat. No. 5,734,605 to Zhu et al., the subject matter of each of which is herein incorporated by reference in its entirety.

The MTJ cells in MRAM devices described by Engel et al. include a bit magnetic region, a reference magnetic region, and an electrically insulating material that forms a layer that acts as a tunneling barrier, as well as those portions of the word line and digit line that carry currents that affect the operation of the MRAM device. The bit magnetic region and reference magnetic region may each comprise more than one layer, some of which can have a magnetic moment associated therewith. Some conventional MRAMs have a bit magnetic region that is a single ferromagnetic layer, and other conventional MRAMs have a bit magnetic region that is a multilayered unbalanced synthetic anti-ferromagnetic region. The bit magnetic region and reference magnetic region are positioned adjacent to the tunneling barrier, on opposite sides thereof.

A resistance of the MTJ device is determined by the relative polarities of a bit magnetic moment and a reference magnetic moment. The bit magnetic moment is positioned where the bit magnetic region is adjacent to the tunneling barrier. The reference magnetic moment is positioned where the reference magnetic region is adjacent to the tunneling barrier. The bit magnetic region may be a free ferromagnetic region, meaning that the bit magnetic moment is free to rotate in the presence of an applied magnetic field. The bit magnetic moment has two stable polarities (states) in the absence of any applied magnetic fields along a magnetic axis, known herein as the "easy axis", determined at the time of deposition of the magnetic material and fabrication of the magnetic regions of the MRAM array. An axis orthogonal to the easy axis is known as the "hard axis."

MTJ devices also have potential applications as magnetic field sensors. In this instance, one ferromagnetic layer has its magnetization fixed, or pinned, and the other ferromagnetic layer has its magnetization free to rotate in response to an external magnetic field from the recording medium (the signal field). When an electric potential is applied between the two ferromagnetic layers, the sensor resistance is a function of the tunneling current across the insulating layer between the ferromagnetic layers. Since the tunneling current that flows perpendicularly through the tunnel barrier layer depends on the relative magnetization directions of the two ferromagnetic layers, recorded data can be read from a magnetic medium because the signal field causes a change of direction of magnetization of the free layer, which in turn causes a change in resistance of the MTJ sensor and a corresponding change in the sensed current or voltage. U.S. Pat. No. 5,650,958 granted to Gallagher et al., the subject matter of which is herein incorporated by reference in its entirety, discloses an MTJ sensor operating on the basis of the magnetic tunnel junction effect. An example of another MTJ sensor is described in U.S. Pat. No. 6,822,838 to Lin et al., the subject matter of which is herein incorporated by reference in its entirety.

One of the major drawbacks to the use of MTJ in MRAM devices and magnetic sensor devices is that MTJ's generally require a plurality of layers, which increases the cost and complexity of forming such devices. Thus, it would be desirable to achieve the benefits realized by MTJ in a more straightforward and streamlined fashion.

Ferromagnetic mixed valence manganites with a perovskite crystalline structure have received considerable attention because of their interesting magnetic and magnetoresistive properties and in particular the colossal magnetoresistance (CMR) effect. Magnetoresistance is a parameter that describes the percentage change in the resistance of a system in the presence of, and in the absence of, a magnetic field. Thin films of these ferromagnetic manganites generally have the formula $R_{1-x}A_xMnO_3$, where R is a rare-earth ion and A represents an alkaline-earth ion. The rare-earth ions are typically lanthanides, although other rare-earth ions are also usable, and the alkaline earth ions are generally selected from calcium, barium, and strontium. In thin films of these materials, the magnetic anisotropy out of the film plane (op) as well as in plane (ip) plays an important role in potential applications. The anisotropy energy in single crystalline epitaxial films of these materials depends not only on doping, stoichiometry, temperature, and film shape, but also on strain and, therefore on the substrate material, film thickness and deposition parameters.

The CMR-effect is an intrinsic effect with a peak at the Curie temperature, $T_C$. The "Curie temperature" is defined as the critical temperature, below which a spontaneous magnetization involving a parallel alignment of spin moments, which is also termed a "ferromagnetic alignment," occurs. At temperatures above $T_C$, spins will be randomly oriented, and compounds that exhibit a CMR-effect will be typically insulators (semiconductors). At temperatures below $T_C$, they will typically be ferromagnetic metals. Mixed valence (perovskite) manganite compounds have been studied intensively because of the colossal magnetoresistance (CMR) effects which are found at temperatures around the combined paramagnetic-ferromagnetic and insulator-metal (IM) transitions.

The negative MR that occurs in the case of CMR is attributable to the reduction in spin disorientation that occurs. The electrical conductivity that occurs is due to electrons "hopping" between $Mn^{3+}$-sites and $Mn^{4+}$-sites via the "double exchange" mechanism, and the "hopping" probability is at its maximum when the magnetic moments of the two Mn-atoms are aligned parallel to one another, as in the ferromagnetic case. In the presence of an applied magnetic field, the probability of "hopping" will increase as the degree of ferromagnetic alignment increases, and resistance will decrease. The effect is thus usually greatest at the Curie temperature.

Another factor that affects CMR materials is electron-lattice coupling. For the $Mn^{3+}$, with three electrons in the energetically lower spin triplet state and the mobile electron in the energetically higher doublet state, a Jahn-Teller distortion of the oxygen octahedron can lead to splitting of the doublet; for the $Mn^{4+}$, the energy of the (empty) doublet can be lowered by coupling to a breathing mode of the lattice. Both effects tend to trap the electron in a polaronlike state, which is in competition with band formation due to ferromagnetic correlations. When the temperature is lowered through the ferromagnetic transition at the Curie temperature ($T_C$), the high resistance polaron state breaks up and changes into a lower resistive ferromagnetic metal state. A second important connection between crystal structure and insulator-metal transition lies in the dependence of the Mn—Mn electron transfer on the Mn—O—Mn bond angles, or equivalently on the orientation of the oxygen octahedra with respect to the main crystal axes. This results in a strong dependence of $T_C$ on either external pressure or mean A-site ionic radius, for which a universal phase diagram (at constant doping) can be constructed.

Despite progress in understanding the role of double exchange and electron-lattice coupling, a comprehensive understanding of the transport mechanism in manganites is still lacking.

For thin films of the perovskite manganite compounds, maximum magnetoresistive values in films are usually larger than in the equivalent bulk materials, which is generally believed to be due to structural disorder from, for example, nonepitaxial growth or partial strain relaxation. Many times, the film thicknesses are on the order of 100 nm or less, making strain relaxation likely. Very thin films (≈10 nm), however, can be uniformly strained by an underlying substrate, and it is possible to predict their physical properties. These properties may be different from the changes induced by hydrostatic or chemical pressure, since in-plane (epitaxial) strain leads to an out-of-plane strain of different sign. Strain can be used to induce properties outside the bulk phase diagram.

The inventors of the present invention have determined that the properties of such manganite thin films and in particular their giant planar Hall effect and the existence of biaxial magnetic anisotropy as well as of other films exhibiting similar properties make them good candidates for use in magnetic bit cells for MRAM devices and for use as the active area in magnetic sensor devices.

SUMMARY OF THE INVENTION

It is an object of the present invention to demonstrate unique properties of manganite thin films that enable them to be used in various applications.

It is another object of the present invention to decrease the complexity of active layers used in magnetic sensors and MRAM devices.

It is another object of the present invention to demonstrate the use of magnetic films, including manganite thin films, that exhibit both planar Hall effect and biaxial magnetic anisotropy as the active area for magnetic sensors and magnetic bits for use in MRAM devices.

To that end the present invention is directed to an improved planar Hall effect magnetic sensor comprising:

an active area comprising a magnetic film exhibiting both planar Hall effect and biaxial magnetic anisotropy;

a first pair of conductive leads arranged on opposing sides of the active area for driving electrical current across the active area in a first direction, which is parallel to a first magnetic easy axis; and a second pair of conductive leads arranged on opposing sides of the active area in a second direction perpendicular to the first direction, which is parallel to a second magnetic easy axis, for measuring voltage across the active area in the second direction.

In another embodiment, the present invention is directed to a magnetic bit cell for use in a planar Hall effect magnetoresistive random access memory (MRAM) device comprising:

an active area comprising a magnetic film exhibiting both planar Hall effect and biaxial magnetic anisotropy;

a first pair of conductive leads arranged on opposing sides of the active area for driving electrical current across the active area in a first direction, which is at 45 degrees relative to a first magnetic easy axis; and a second pair of conductive leads arranged on opposing sides of the active area in a second direction perpendicular to the first direction, which is at 45 degrees relative to a second magnetic easy axis, for measuring voltage across the active area in the second direction.

Methods of using the magnetic sensor and the magnetic bit cells of the invention are also described.

BRIEF DESCRIPTION OF THE DRAWINGS

While all features may not be labeled in each Figure, all elements with like reference numerals refer to similar or identical parts.

DETAILED DESCRIPTION OF THE INVENTION

Figure 1:
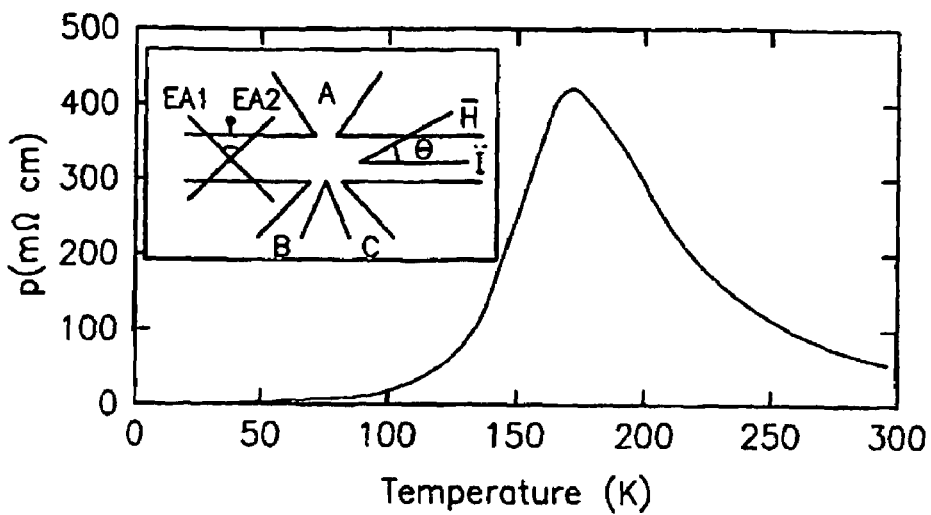
FIG. 1 depicts a graph of the resistivity versus temperature for a lanthanide strontium manganese oxide thin film. The inset depicts the pattern used for resistivity and Hall measurements. The two easy axes directions (EA1 and EA2) and the angle ($\theta$) between the applied field and the current are also shown. The current path is along either the [100] or [010] direction.

The present invention is directed to the use of manganite thin films and other magnetic films that exhibit both planar Hall effect and biaxial magnetic anisotropy as the active area for magnetic bit cells in MRAM devices and for use in magnetic sensor applications.

The manganite thin films of the invention are ferromagnetic manganites of the formula $R_{1-x}A_xMnO_3$, wherein R is a rare-earth metal, A is an alkaline earth metal, and x is generally between about 0.15 and about 0.5. The rare earth metal is typically lanthanum, and the alkaline earth metal is generally selected from the group consisting of strontium, calcium, and barium. Examples of these ferromagnetic manganites include $La_{1-x}Sr_xMnO_3$, $La_{1-x}Ca_xMnO_3$, and $La_{1-x}Ba_xMnO_3$. Depending on the choice of R and A, the preferred and maximum values of x may vary. For example, compositions containing strontium typically have a maximum value of x=0.4 and a preferred value of x=0.3, while compositions containing calcium typically have a maximum value of x=0.5 and a preferred value of x=0.33, although other values are possible depending on the deposition conditions.

The manganite thin film is epitaxially grown on a perovskite single crystal. In a preferred embodiment, the manganite thin film is deposited on the crystal by physical vapor deposition. Physical vapor deposition may be by molecular beam epitaxy (MBE), sputtering, or laser ablation. MBE is a preferred method of physical vapor deposition and is typically performed under vacuum with a background oxygen pressure of about 10-300 millitorr and at a temperature of about 600-700° C. Although various perovskite single crystals are usable in the practice of the invention, strontium titanium oxide ($SrTiO_3$) is preferred for some applications. The substrate may also comprise a layer of a perovskite single crystal (i.e., $SrTiO_3$) on silicon.

The deposited thin film generally has a thickness between about 4 nm and about 100 nm. More preferably, the deposited thin film has a thickness between about 10 nm and about 50 nm.

The Curie temperature of the thin film is generally between about 150 K and about 350 K.

The planar Hall effect (PHE) in magnetic conductors occurs when the resistivity depends on the angle between the current density J and the magnetization M, an effect known as anisotropic magnetoresistance (AMR). In an anisotropic conductor, a current not flowing along one of the principal axes of the resistivity tensor is not parallel to the internal electric field. Thus, for a current path not along one of the principle axes, in addition to the longitudinal electric field, there is also a transverse electric field. In magnetic conductors, due to the dependence of the resistivity on the angle between the current and the magnetization (the anisotropic magnetoresistance), the in-plane principal axes of resistivity are typically parallel and perpendicular to the magnetization.

When M makes an angle $\theta$ with J, the AMR effect is described by the expression $\rho=\rho_\perp+(\rho_\parallel-\rho_\perp)\cos^2 \theta$, where $\rho_\perp$ and $\rho_\parallel$ are the resistivities for J$\perp$M and J$\parallel$M, respectively. The AMR yields a transverse "Hall-like" field if J is not parallel or perpendicular to M. Assuming $J=J_x x$ and M are in the x-y plan with an angle $\theta$ between them, the generated electric field has both a longitudinal component:

$$E_x=\rho_\perp j_x+(\rho_\parallel-\rho_\perp)j_x \cos^2 \theta, \qquad (1)$$

and a transverse component:

$$E_y=(\rho_\parallel-\rho_\perp)j_x \sin \theta \cos \theta. \qquad (2)$$

This latter component is denoted the planar Hall effect. Unlike the ordinary and extraordinary Hall effects, the PHE shows an even response upon inversion of J and M. Therefore, the PHE is most noticeable when M changes its axis of orientation, in particular between θ=45° and θ=135°.

The PHE in magnetic materials has previously been investigated in 3d ferromagnetic metals, such as Fe, Co and Ni films, as a tool to study in-plane magnetization. This concept is described in U.S. Patent Application Publication No. 2004/0070038 A1 to Tang et al., the subject matter of which is herein incorporated by reference in its entirety. The PHE has also been studied as a low-field magnetic sensor. However, the PHE was not widely used because the transverse resistivity of metals is usually too small to produce a high enough signal.

Recently however, large resistance jumps in the PHE have been discovered in the magnetic semiconductor Ga(Mn)As below its Curie temperature ~50K. Four orders of magnitude larger than what has been observed in ferromagnetic metals, it is called the giant planar Hall effect (GPHE). Ga(Mn)As exhibits biaxial magnetocrystalline anisotropy; consequently, the magnetization reversal in a field scan occurs in two steps of 90° rotations. When the current path lies between the two easy axes, the 90° rotations lead to switching-like behavior in the PHE, which is similar to the switching resistivity curves observed in giant magnetoresistance (GMR) heterostructures or tunneling magnetoresistance (TMR) trilayers. This suggests that the GPHE in magnetic materials may be suitable for applications in spintronics, such as field sensors and non-volatile memory elements.

The inventors of the present invention have discovered the GPHE in manganite thin films, and especially LSMO thin films, at temperatures as high as 140K. By optimizing the chemical composition and the device geometry, the inventors of the present invention have also achieved effects at higher temperatures, thus allowing for the application of the GPHE in manganites, such as magnetic sensors and non-volatile memory devices.

The GPHE was discovered in the colossal magnetoresistive material (CMR), $La_{1-x}Sr_xMnO_s$ (LSMO). When x is between 0.15 and 0.3, LSMO is a ferromagnetic metal below the Curie temperature. Depending on the carrier concentration, the Curie temperature of LSMO ranges from about 150 K to about 350 K.

Figure 2:
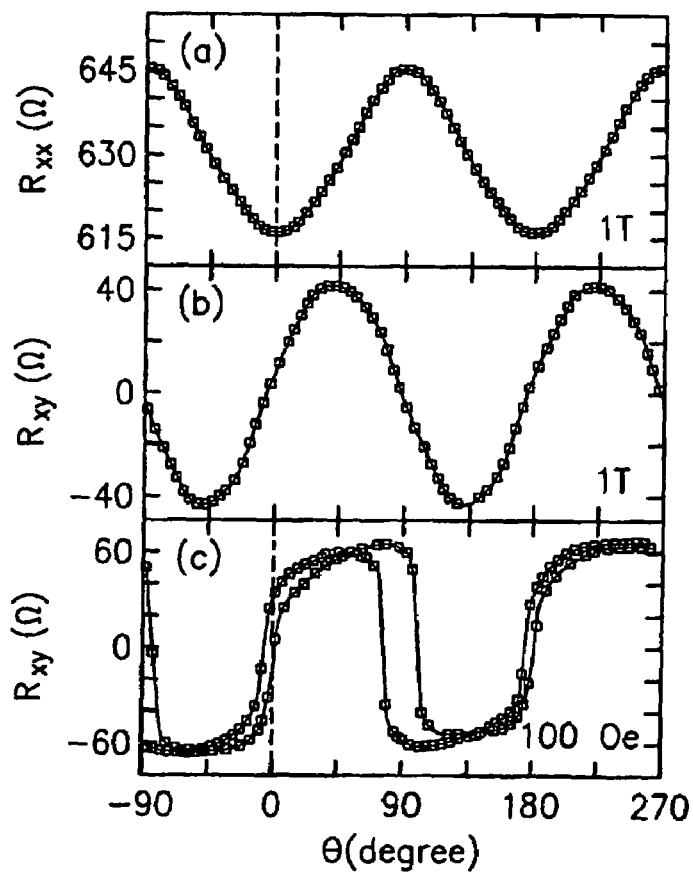
FIG. 2 depicts measurements of $R_{xx}$ and $R_{xy}$ versus $\theta$ at T=120 K. (a) $R_{xx}$ measured between B and C. The line is a fit to $\cos^2 \theta$. (b) $R_{xy}$ measured between A and C. The line is a fit to $\sin \theta \cos \theta$. (c) $R_{xy}$ measured between A and C with H=100 Oe.
Figure 3:
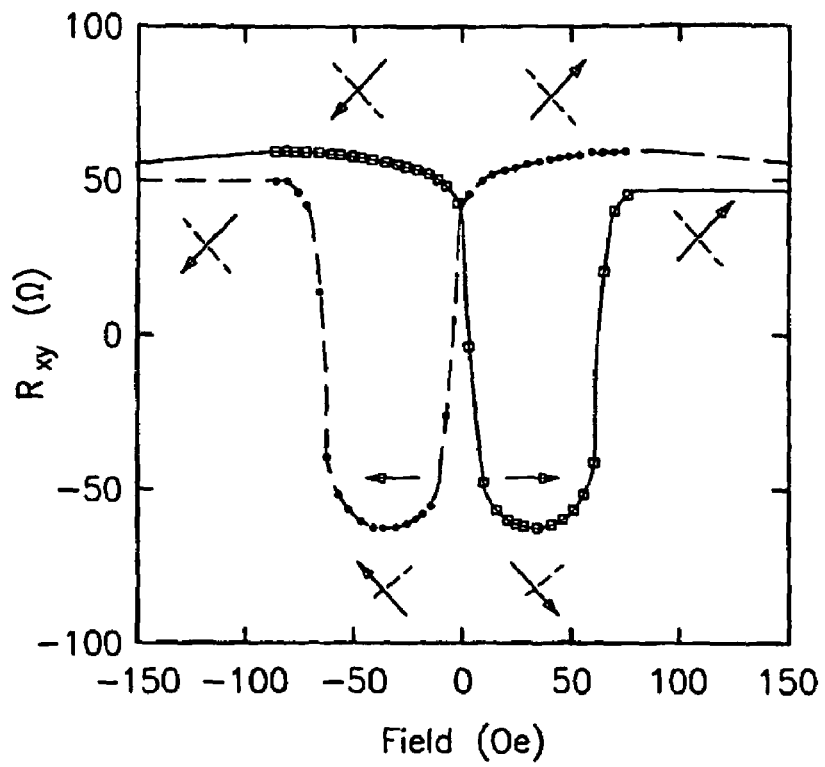
FIG. 3 depicts a graph of the planar Hall effect (PHE) versus H at 120 K with $\theta=10°$. The arrow shows the magnetization direction along one of the easy axes while the dashed lines indicate the other easy axis direction. The horizontal arrows indicate the field sweep directions.

As depicted in FIG. 1, the inventors of the present invention formulated thin films of LSMO with a doping level of x~0.16 and resistivity-peak temperature of ~180 K. As seen in FIG. 2 and FIG. 3, the films exhibit transverse resistivity jumps, comparable to that observed in Ga(Mn)As, and which persist up to temperatures in excess of 140 K.

Thin films (approximately 40 nm) of LSMO were deposited epitaxially on single-crystal [001] $SrTiO_3$ substrates using off-axis magnetron sputtering. θ–2θ x-ray diffraction revealed c-axis oriented growth (in the pseudocubic frame), with a lattice constant of ~0.385 nm, which is consistent with a strained film. No impurity phases were detected.

Rocking curves taken around the 001 reflection had a typical full width at half maximum of 0.05°. The film surface was characterized using atomic force microscopy (AFM), which shows a typical root-mean-square surface roughness of ~0.2 nm.

The films were patterned into Hall bars using photolithography for longitudinal and transverse resistivity measurements, as seen in FIG. 1, with current paths along the [100] and [010] directions. A layer of gold or other noble metal is generally plated on the outer edges of the Hall bars to lower the contact resistance.

The inventors of the present invention investigated the AMR in the LSMO films with a constant magnetic field applied in the plane of the film. FIG. 2 demonstrates the transverse resistivity and the longitudinal resistivity as a function of θ, the angle between the applied magnetic field and the current. The longitudinal resistance, $R_{xx}$, was measured between B and C, as depicted in FIG. 1. The transverse resistance, $R_{xy}$, was obtained by measuring the resistance between A and C and subtracting the longitudinal component based on the $R_{xx}$ measurement.

At high fields the magnetization is expected to be parallel to the applied field. We found that $R_{xx}(\theta)$ had a $\cos^2(\theta)$ dependence while $R_{xy}(\theta)$ had a $\sin(\theta)\cos(\theta)$ dependence. At lower fields, the angular dependence changed, as the effect of the magnetocrystalline anisotropy becomes significant, and we observed sharp switches in the PHE as seen in FIG. 2c. We interpret the switches as jumps between easy axes; since the symmetry axes for the switchings are θ=0° and θ=90° it is reasonable that the easy axes are in between, namely at θ=45° and θ=135°.

FIG. 3 shows the switching behavior as a function of field sweeps with θ=10°. At high positive field, the magnetization is parallel to the applied field, and the PHE is positive. As the field is reduced, the magnetization gradually aligns along the easy axis closer to the field orientation (EA2). As the field orientation is reversed, the magnetization first switches to the other easy axis (EA1), which is an intermediate state with a negative PHE. As the field becomes more negative, the magnetization goes back to the initial easy axis (EA2), but with opposite polarity. A similar process happens when the field is scanned from negative to positive field.

Figure 4:
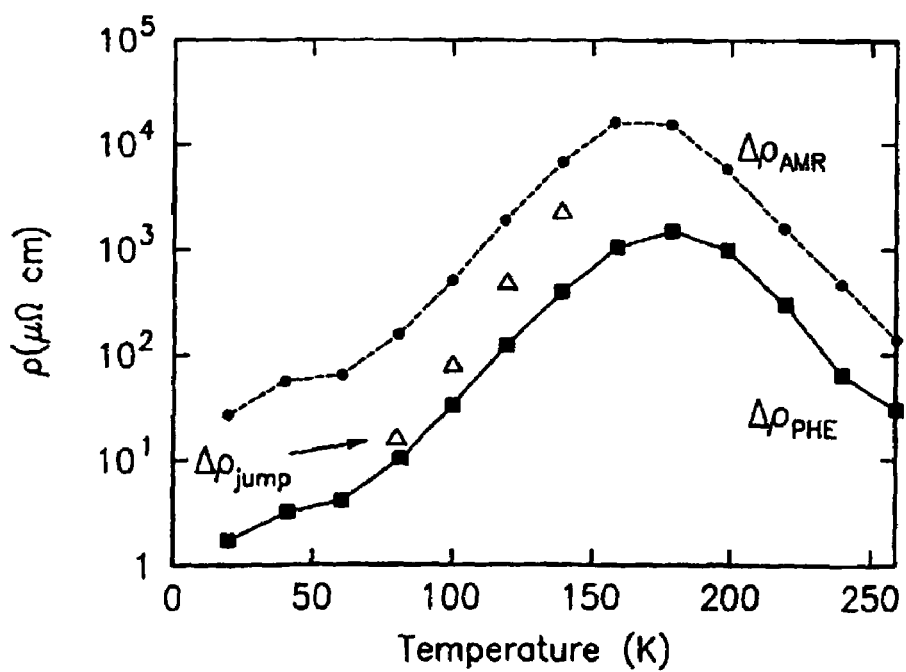
FIG. 4 depicts $\Delta\rho$ extracted from the AMR ($\Delta\rho_{AMR}$), the PHE ($\Delta\rho_{PHE}$) and the field sweep jump measurements ($\Delta\rho_{jump}$) as a function of temperature. $\Delta\rho_{AMR}$ (connected circles), $\Delta\rho_{PHE}$ (connected squares)—both measured in a 4 T field, and $\Delta\rho_{jump}$ (unconnected triangulars) vs. T. Note that $\Delta\rho_{jump}$ is extracted at much lower fields.

The temperature dependence of the switching shows that the jumps increase rapidly as a function of increasing temperature. Based on the fits to the experimental data (as presented in FIG. 2) and Equations 1 and 2, we calculated $\Delta\rho=\rho_\parallel-\rho_\perp$ at different temperatures. FIG. 4 shows $\Delta\rho$ extracted from the AMR ($\Delta\rho_{AMR}$), the PHE ($\Delta\rho_{PHE}$) and the field sweep jump measurements ($\Delta\rho_{jump}$) as a function of temperature. An in-plane magnetic field of 4 T was used to extract $\Delta\rho_{AMR}$ and $\Delta\rho_{PHE}$ at all temperatures. We see that $\Delta\rho_{AMR}$ and $\Delta\rho_{PHE}$ show similar temperature dependencies; however, there is a significant difference in their magnitude.

Considering possible sources for this difference, we note that Equations 1 and 2 are based on the assumption of uniform current, while the manganites are intrinsically inhomogeneous and exhibit percolative current paths. In addition, these equations disregard the intrinsic crystalline anisotropy and are expected to be valid when this anisotropy is averaged (as in amorphous films). Here, the films are epitaxial and the role of crystal anisotropy is yet to be determined. Recent results obtained by the inventors of the present invention on patterns with current paths at various angles relative to the crystal orientation strongly suggest that the intrinsic crystalline anisotropy plays a central role in the observed difference.

As shown in FIG. 4, the AMR and GPHE are also observed above $T_c$, and while switching is naturally not observed, the GPHE may still be interesting for applications where non-hysteric behavior in field is required such as Hall sensors.

Bi-axial magnetic anisotropy in [001] LSMO films has previously been reported and there have been studies of biaxial anisotropy and AMR in other colossal magnetoresistance materials, such as $La_{1-x}Ca_xMnO_3$ (LCMO). Therefore, the inventors of the present invention expect to observe the GPHE and switching behavior in CMR materials with other doping levels and chemical compositions.

The inventors of the present invention have discovered that the manganite thin films described herein and other magnetic films that exhibit both planar Hall effect and biaxial magnetic anisotropy may be suitable replacements for the multi-layered MTJ's of the prior art and usable in the same systems to build MRAM devices and magnetic sensors in a more streamlined and cost effective manner.

Figure 5:
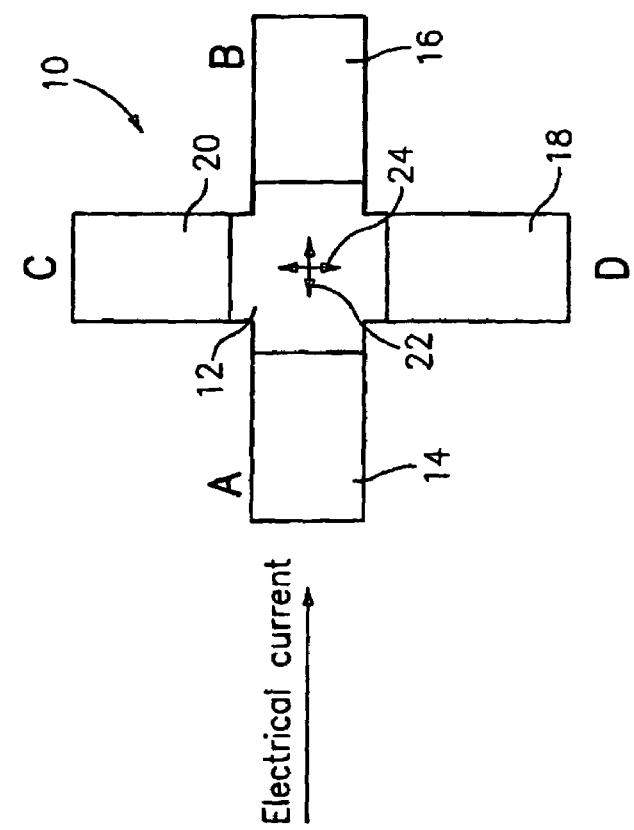
FIG. 5 shows a view of a magnetic sensor in accordance with the present invention.

As depicted in FIG. 5, the present invention is also directed to a planar Hall effect magnetic sensor 10. The active area 12 of the magnetic sensor 10 is the manganite thin film. The approximate dimensions of the active area 12 are typically on the order of 1 micron×1 micron or less. A first pair of conductive leads 14 and 16 are arranged on opposing sides of the active area 12 for driving electrical current across the active area in a first direction (from A to B). A second pair of conductive leads 18 and 20 are arranged on opposing sides of the active area 12 in a second direction perpendicular to the first direction for measuring voltage across the active area in the second direction (from C to D).

The magnetic film may be deposited on the perovskite single crystal substrate (or on other substrates if non-perovskite magnetic films are used) in the shape of a cross having arm portions of approximately equal length. The first pair of conductive leads 14 and 16 and the second pair of conductive leads 18 and 20 are then coated on the arm portions of the magnetic film, leaving a middle portion of the magnetic film uncovered by the conductive leads. The purpose of the conductive leads is to decrease the resistance of the device when high resistance manganite films are used. If the magnetic film is a good conductor, there may not be need for the conductive leads.

The magnetic film is deposited on the substrate so that the two easy axes 22 and 24 of the film are perpendicular to each other and are aligned with the first pair of conductive leads 14 and 16 and the second pair of conductive leads 18 and 20. This may be achieved since in magnetic films with intrinsic biaxial anisotropy, the direction of the easy axes is fixed relative to the crystal orientation of the film and there is always a possibility of patterning the magnetic sensor 10 so that the first pair of conductive leads 14 and 16 in the first direction (from A to B) are parallel to one of the easy axes. This configuration will ensure maximum sensitivity because the measured voltage is proportional to $\sin 2\theta$, where $\theta$ is the angle between the current and the magnetization. Therefore, the maximum change with the changing angle is proportional to $\cos 2\theta$ which is at a maximum when $\theta$ is zero or 90°.

Although the conductive leads may be formed from any good quality conductive metal, the conductive leads are preferably copper.

Figure 6:
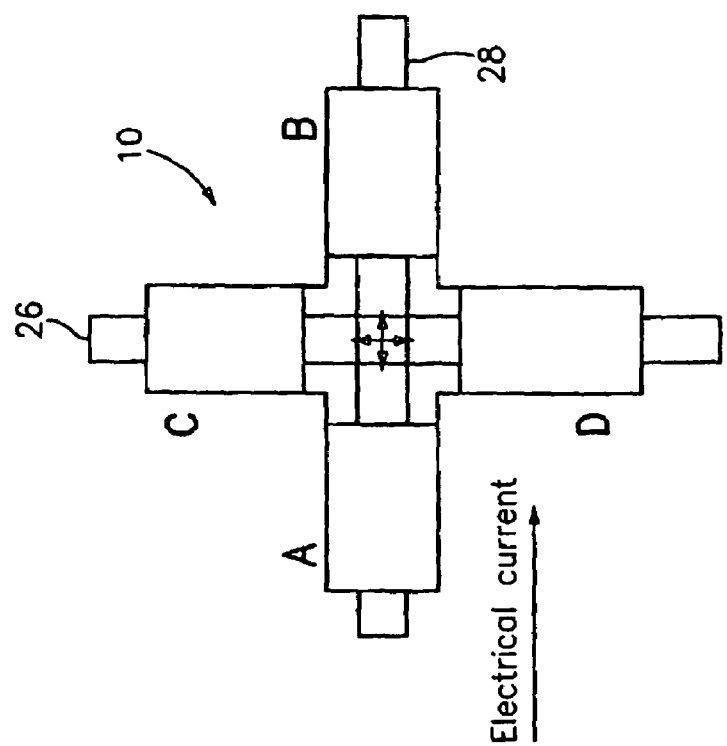
FIG. 6 shows a different view of the magnetic sensor in accordance with the present invention.

As seen in FIG. 6, the magnetic sensor 10 also comprises two conductive films 26 and 28 deposited parallel to the first pair of conductive leads 14 and 16 and the second pair of conductive leads 18 and 20 and separated from the active area 12 by one or more insulating layers (not shown). The two conductive films 26 and 28 are used to generate a magnetic field. The current in the conductive film 26 generates a magnetic field parallel to the first direction (from A to B) and the current in the conductive film 28 generates a magnetic field parallel to the second direction (from C to D). The strength of the magnetic field that is generated is typically between about 50 Oe and about 150 Oe.

In one embodiment of the invention, the two conductive films 26 and 28 overlap each other and are positioned below the active area 12 of the magnetic sensor 10, separated by the insulating layer. In an alternate embodiment, the two conductive films 26 and 28 overlap each other and are positioned above the active area 12 of the magnetic sensor 10, separated by the insulating layer. In another alternate embodiment, one of the conductive films 26 is positioned above the active area 12 of the magnetic sensor 10 separated from the active area 12 by a first insulating layer and the other conductive film 28 is positioned below the active area 12 of the magnetic sensor 10 separated from the active area 12 by a second insulating layer. If the magnetic sensor is not used as part of a dense array of sensors, a preferred embodiment of the invention would be with the two conductive films 26 and 28 positioned above the active area 12 of the magnetic sensor 10, separated by the insulating layer.

The conductive films 26 and 28 are typically selected from the group consisting of copper, aluminum, and gold. In a preferred embodiment, the conductive film is copper.

The one or more insulating layers are typically selected from the group consisting of aluminum oxides, magnesium oxides, and strontium titanite. In a preferred embodiment, the one or more insulating layers are an aluminum oxide when the insulating layer is above the active area or are strontium titanite when the insulating layer is below the active area.

The planar Hall effect magnetic sensor device 10 is used by presetting the magnetization in the magnetic film in the first direction (from A to B) with a pulse of current along the second direction (from C to D) to sensitize the magnetic sensor 10 to any magnetic field applied in the second direction (from C to D), which is determined by measuring the change in voltage in the second direction.

In one embodiment, after the magnetization is preset in the first direction, an alternating current (that generates an alternating magnetic field) is applied in the second direction. The effect of an external magnetic field may then be determined by monitoring its effect on the alternating voltage response. If the magnetization is preset in the second direction, then the sensor will be sensitized to any magnetic field applied in the first direction. A combination of two measurements (two presets) will give information about the field vector in the film plane.

Figure 7:
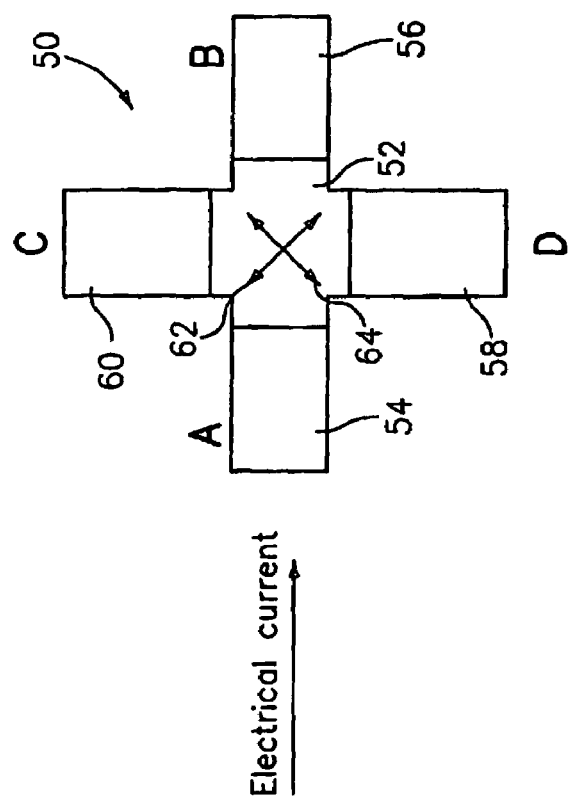
FIG. 7 shows a view of a magnetic bit cell for use in an MRAM device in accordance with the present invention.

As depicted in FIG. 7, the present invention is also directed to a magnetic bit cell 50 for use in a planar Hall effect magnetoresistive random access memory (MRAM) device. Each magnetic bit cell 50 is generally on the order of 1 micron×1 micron or less in size. The magnetic bit cell 50 has an active area 52 comprising a magnetic film of the invention. A first pair of conductive leads 54 and 56 are arranged on opposing sides of the active area 52 for driving electrical current across the active area in a first direction (from A to B). A second pair of conductive leads 58 and 60 are arranged on opposing sides of the active area 52 in a second direction perpendicular to the first direction for measuring voltage across the active area 52 in the second direction (from C to D). The purpose of the conductive leads 58 and 60 is to decrease the resistance of the device when high resistance manganite films are used. If the magnetic film is a good conductor, there may be no need for the conductive leads.

As with the magnetic sensor, the magnetic film is deposited on the perovskite crystal (or on other substrates if non-perovskite magnetic films are used) in the shape of a cross having arm portions of approximately equal length. The first pair of conductive leads and the second pair of conductive leads are coated on the arm portions of the magnetic film, and a middle portion of the magnetic film is left uncovered by the conductive leads.

However, for use as a magnetic bit cell 50, the magnetic film is grown so that easy axes 62 and 64 of the thin film are perpendicular to each other and at a 45-degree angle relative to the direction of the current. This may be achieved since in magnetic films with intrinsic biaxial anisotropy the direction of the easy axes is fixed relative to the crystal orientation of the film and there is always a possibility of patterning the magnetic bit cell 50 so that the magnetic easy axes are orthogonal to the direction of the current. This configuration will ensure maximum sensitivity of the magnetic bit cell because the measured voltage is proportional to sin 2θ, where θ is the angle between the current and the magnetization. Thus, the maximum change when the magnetization flips from one easy axis to the other is obtained when it jumps from 45° to 135° (i.e., sin 2θ changes from +1 to −1).

Figure 8:
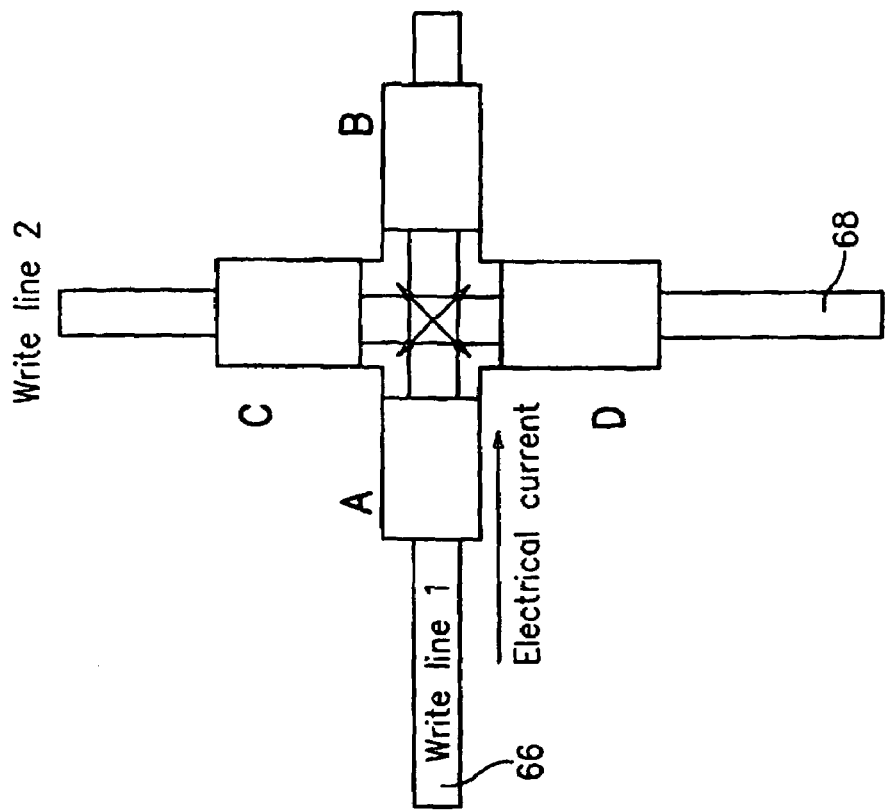
FIG. 8 shows a different view of the magnetic bit cell in accordance with the present invention.

As seen in FIG. 8, the magnetic bit cell 50 also comprises a first write bit line 66 and a second write bit line 68 electrically isolated from the magnetic bit cell 50 by an insulating layer (not shown), which are arranged perpendicular to each other. The first write bit line 66 and the second write bit line 68 each comprise a conductive film, through which current can be passed. The conductive film is preferably copper, although other materials would be known to one skilled in the art. As with the magnetic sensor, the insulating layer is preferably an aluminum oxide or strontium titanite. Also, as with the magnetic sensor, different configurations of the write bit lines are possible, i.e., the first write bit line 66 and the second write bit line 68 may be positioned above or below the active area 52 and the write bit lines may be overlapping. For a high-density MRAM array it is generally preferable to have the magnetic field generating conducting lines (first write bit line 66 and second write bit line 68) positioned above and below the active area 52 of the magnetic bit cell 50.

During operation of the MRAM device, a combination of current in the first write bit line 66 and the second write bit line 68 generates a field that flips the magnetization between the two easy axes 62 and 64 of the magnetic bit cell 50. A read operation is performed on the magnetic bit cell 50 by driving electrical current through the first pair of leads 54 and 56 in the first direction across the active area 52 and measuring the voltage across the active area 52 with the second set of leads 58 and 60 in the second direction. A combination of currents in the two write bit lines 66 and 68 generates a magnetic field which flips the magnetization between the two easy axes 62 and 64. The sign of the voltage indicates along which of the two easy axes 62 or 64 the magnetization in the bit cell 50 resides.

What is claimed is:

1. A magnetic bit cell for use in a planar Hall effect magnetoresistive random access memory (MRAM) device, the magnetic bit cell comprising:
    an active area comprising a magnetic film that exhibits both planar Hall effect and biaxial magnetic anisotropy;
    a first pair of conductive leads arranged on opposing sides of the active area for driving electrical current across the active area in a first direction; and
    a second pair of conductive leads arranged on opposing sides of the active area in a second direction perpendicular to the first direction for measuring voltage across the active area in the second direction;
    wherein the magnetic film is epitaxially grown on a perovskite single crystal so that easy axes of the thin film are perpendicular to each other and at a 45-degree angle relative to the direction of the current.

2. The magnetic bit cell according to claim 1, wherein the magnetic film is deposited on the perovskite crystal in the shape of a cross having arm portions of approximately equal length, and the first pair of conductive leads and the second pair of conductive leads are coated on the arm portions of the magnetic film, wherein a middle portion of the magnetic film is left uncovered by the conductive leads.

3. The magnetic bit cell according to claim 1, wherein the conductive leads are copper.

4. The magnetic bit cell according to claim 1, further comprising a first write bit line and a second write bit line electrically isolated from the magnetic bit cell by an insulating layer.

5. The magnetic bit cell according to claim 4, wherein the first write bit line and the second write bit line are arranged perpendicular to each other.

6. The magnetic bit cell according to claim 5, wherein the first write bit line and the second write bit line overlap each other and are positioned below the active area of the magnetic bit cell, separated by the insulating layer.

7. The magnetic bit cell according to claim 5, wherein the first write bit line and the second write bit line overlap each other and are positioned above the active area of the magnetic bit cell, separated by the insulating layer.

8. The magnetic bit cell according to claim 5, wherein one of the write bit lines is positioned substantially directly above the active area of the magnetic bit cell separated from the active area by a first insulating layer and the other write bit line is positioned substantially directly below the active area of the magnetic bit cell separated from the active area by a second insulating layer.

9. The magnetic bit cell according to claim 4, wherein the insulating layer is an aluminum oxide or strontium titanite.

10. The magnetic bit cell according to claim 4, wherein the first write bit line and the second write bit line comprise a conductive film through which current can be passed.

11. The magnetic bit cell according to claim 10, wherein a combination of current in the first write bit line and the second write bit line generates a field that flips the magnetization between the two easy axes of the magnetic bit cell.

12. The magnetic bit cell according to claim 11, wherein the sign of the voltage indicates along which of the two easy axes the magnetization in the bit cell resides.

13. The magnetic bit cell according to claim 1, wherein the magnetic film is deposited on the crystal by physical vapor deposition.

14. The magnetic bit cell according to claim 13, wherein the deposited film has a thickness between about 4 nm and about 100 nm.

15. The magnetic bit cell according to claim 14, wherein the deposited film has a thickness between about 10 nm and about 50 nm.

16. The magnetic bit cell according to claim 1, wherein the magnetic film is a manganite thin film of the formula $R_{1-x}A_xMnO_3$, wherein R is a rare-earth metal, A is an alkaline earth metal, and x is between about 0.15 and about 0.5.

17. The magnetic bit cell according to claim 16, wherein the rare earth metal is lanthanum.

18. The magnetic bit cell according to claim 16, wherein the alkaline earth metal is selected from the group consisting of strontium, calcium, and barium.

* * * * *

UNITED STATES PATENT AND TRADEMARK OFFICE
CERTIFICATE OF CORRECTION

PATENT NO. : 7,684,147 B2  Page 1 of 1
APPLICATION NO. : 10/582813
DATED : March 23, 2010
INVENTOR(S) : Charles Ahn et al.

It is certified that error appears in the above-identified patent and that said Letters Patent is hereby corrected as shown below:

Title Page
Please state the name of the assignees as follows:

--(73) Assignees: Bar Ilan University, Ramat Gan (IL)
   Yale University, New Haven, CT (US)--.

Signed and Sealed this

Thirteenth Day of July, 2010

David J. Kappos
*Director of the United States Patent and Trademark Office*